United States Patent
Kawamura et al.

(10) Patent No.: US 7,456,570 B2
(45) Date of Patent: Nov. 25, 2008

(54) ORGANIC EL DISPLAY HAVING COLOR CONVERTING FILTERS

(75) Inventors: Yukinori Kawamura, Kanagawa (JP); Koji Kawaguchi, Kanagawa (JP); Kenya Sakurai, Kanagawa (JP)

(73) Assignee: Fuji Electric Holdings Co., Ltd. (JP)

( * ) Notice: Subject to any disclaimer, the term of this patent is extended or adjusted under 35 U.S.C. 154(b) by 417 days.

(21) Appl. No.: 10/515,563

(22) PCT Filed: May 21, 2003

(86) PCT No.: PCT/JP03/06326
§ 371 (c)(1),
(2), (4) Date: Nov. 22, 2004

(87) PCT Pub. No.: WO03/101155
PCT Pub. Date: Dec. 4, 2003

(65) Prior Publication Data
US 2005/0248929 A1    Nov. 10, 2005

(30) Foreign Application Priority Data
May 23, 2002    (JP)    ............................... 2002-149688

(51) Int. Cl.
*H01J 1/62*    (2006.01)
*H01J 63/04*    (2006.01)

(52) U.S. Cl. ........................ 313/512; 313/504; 313/506; 313/507; 313/509

(58) Field of Classification Search .......... 313/498–512
See application file for complete search history.

(56) References Cited

U.S. PATENT DOCUMENTS

| | | | |
|---|---|---|---|
| 6,117,529 A * | 9/2000 | Leising et al. | 428/209 |
| 6,563,263 B1 * | 5/2003 | Kawaguchi et al. | 313/509 |
| 6,573,579 B1 * | 6/2003 | Ho et al. | 257/431 |
| 2001/0050532 A1 * | 12/2001 | Eida et al. | 313/504 |
| 2002/0102480 A1 * | 8/2002 | Washizu et al. | 430/7 |
| 2002/0105265 A1 * | 8/2002 | Chuang | 313/506 |

(Continued)

FOREIGN PATENT DOCUMENTS

JP    3-152897 A    6/1991

(Continued)

OTHER PUBLICATIONS

Office Action issued to a relatd Japanese Application No. 2004-507292, dated Feb. 14, 2008, and translation of relevant portions thereof.

*Primary Examiner*—Karabi Guharay
*Assistant Examiner*—Bumsuk Won
(74) *Attorney, Agent, or Firm*—Rossi, Kimms & McDowell LLP

(57) ABSTRACT

An organic EL display includes an organic EL device comprising lower electrodes, upper electrodes and an organic EL layer therebetween, and color-converting filter layers that absorb light emitted from the organic EL device and carry out color conversion, a layer having a color filter function of transmitting only the color of the light emitted from the organic EL device is provided between the color-converting filter layers and the organic EL device, whereby there is provided an organic EL display that has good display quality, with a high contrast ratio under illumination with a fluorescent lamp, sunlight or the like.

15 Claims, 2 Drawing Sheets

U.S. PATENT DOCUMENTS

2002/0113241 A1* 8/2002 Kubota et al. .................. 257/79
2002/0122144 A1* 9/2002 Yoshida et al. ................. 349/61

FOREIGN PATENT DOCUMENTS

| JP | 8-286033 A | 11/1996 |
| JP | 9-115668 A | 5/1997 |
| JP | 9-208944 A | 8/1997 |
| JP | 10-162958 A | 6/1998 |
| JP | 2000-3786 A | 1/2000 |
| JP | 2002-015861 A | 1/2002 |
| JP | 2002-93579 A | 3/2002 |
| JP | 2003-115378 A | 4/2003 |

* cited by examiner

ORGANIC EL DISPLAY HAVING COLOR CONVERTING FILTERS

TECHNICAL FIELD

The present invention relates to the construction of an organic EL display, and in particular relates to an improvement of the contrast of the organic EL display.

BACKGROUND ART

In recent years, with organic electroluminescent devices (hereinafter referred to as 'organic EL devices'), a method has been proposed in which an organic EL device is combined with color-converting layers obtained by processing fluorescent color-converting materials into the form of a film, whereby colors different to the color emitted by the EL device are obtained (see, for example, Japanese Patent Application Laid-open No. 3-152879 and Japanese Patent Application Laid-open No. 5-258860).

Such a color conversion method has the following advantages as a method for obtaining a desired spectrum when constructing a full-color display: (1) compared with a three primary color emission method, there are fewer restraints on the emitted color, and hence a light emitter constitution with higher efficiency and higher brightness can be used, and as a result it is easy to improve the efficiency and make the patterning more detailed; and (2) compared with a white light emitter plus color filter method, less light is lost through the filters, and hence it is easier to increase the efficiency.

With the color conversion method using an organic light emitter that emits blue light, the blue light is subjected to wavelength conversion into green light and red light (see, for example, Japanese Patent Application Laid-open No. 3-152879, Japanese Patent Application Laid-open No. 8-286033, and Japanese Patent Application Laid-open No. 9-208944). If such emitted light wavelength converting films containing fluorescent colorants are patterned with high detail, then a full-color luminescent-type display can be constructed even if low-energy radiation such as near ultraviolet light or visible light from a light emitter is used.

Materials that emit fluorescence from visible light are generally used as the fluorescent color-converting materials used in the color conversion method. However, such materials also react to light other than that from the organic EL device, and hence the ability to see whether or not the light emitters (pixels) are lit is reduced under illumination with, for example, a fluorescent lamp or sunlight. That is, under an ordinary usage environment, the color-converting layers will be excited even when the light emitters are not lit, and hence the brightness ratio between when a light emitter is lit and not lit will inevitably drop, and thus a problem will arise in that the contrast ratio in bright places will drop, and hence the display quality will drop.

Attempts have been made to ameliorate this problem by inserting a contrast-improving layer, i.e. a color filter layer, that block the infiltration of light into the color-converting layers from the outside (see, for example, Japanese Patent No. 2838064 and Japanese Patent Application Laid-open No. 2000-3786). This color filter layer is a filter layer that transmits only the color of the light emitted by the color-converting layers. However, even if such a constitution is adopted, there is light that passes through the color filter layer for improving the contrast and the color-converting layers and reaches lower metal electrodes, is reflected at the surface of the metal electrodes, and is led out to the outside as reflected light; the problem that this reflected light causes a worsening of the contrast ratio as before has not been resolved.

SUMMARY OF THE INVENTION

The present inventors have discovered that the contrast ratio can be improved using the means described below for counteracting the drop in the contrast ratio described above. That is, in the case of an organic EL display having an organic EL device comprising lower electrodes, upper electrodes and an organic EL layer therebetween, and color-converting filter layers that absorb light emitted from the organic EL device and carry out fluorescent conversion, a construction has been adopted in which a layer having a color filter function of transmitting only the color of light emitted from the organic EL device is provided between the color-converting filter layers and the organic EL device.

BRIEF DESCRIPTION OF THE DRAWINGS

The invention will be described in greater detail with reference to the preferred embodiments of the invention and the accompanying drawings, wherein.

DETAILED DESCRIPTION OF THE PREFERRED EMBODIMENTS OF THE INVENTION

Figure 1:
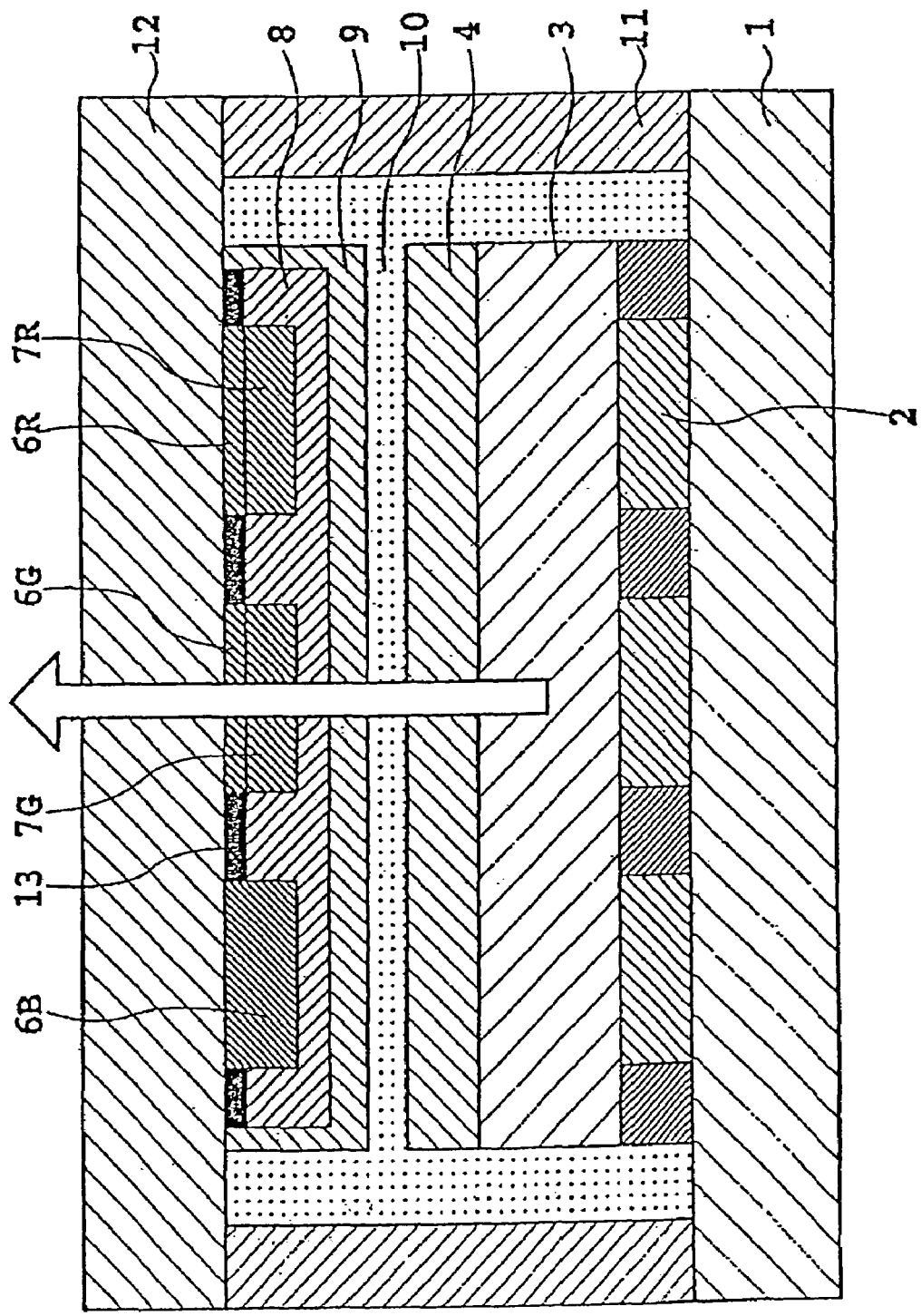
FIG. 1 is a schematic sectional view showing a top emission type organic EL display of the present invention.

As the organic EL device, one having a layer structure such as the following is adopted (for clarity, the two sets of electrodes have been included).

(1) Anodes/organic EL light-emitting layer/cathodes
(2) Anodes/hole injection layer/organic EL light-emitting layer/cathodes
(3) Anodes/organic EL light-emitting layer/electron injection layer/cathodes
(4) Anodes/hole injection layer/organic EL light-emitting layer/electron injection layer/cathodes
(5) Anodes/hole injection layer/hole transport layer/organic EL light-emitting layer/electron injection layer/cathodes With the color conversion method of the present embodiment, in the above layer structures, with a top emission type in which light is extracted in a direction opposite to that of the substrate on which the lower electrodes are formed, it is necessary for the cathodes to be transparent in the wavelength region of the light emitted by the organic EL light-emitting layer; the light is emitted via these transparent electrodes.

The transparent cathodes are preferably made to have a construction in which electron injecting ability is bestowed using an ultra-thin film (not more than 10 nm) of an electron injecting metal selected from alkali metals such as lithium, sodium and potassium, alkaline earth metals such as calcium, magnesium and strontium, and fluorides and so on thereof, or an alloy thereof with other metals or a compound thereof, and then a transparent electrode film of ITO, IZO or the like is formed thereon.

As the lower anodes, a material having a high work function is used to improve the hole injecting ability. A transparent electrically conductive oxide such as ITO or IZO can be used as such a material. Moreover, so that the light emitted from the organic EL light-emitting layer can be extracted from the transparent cathode side, the lower anodes preferably reflect the light from the organic EL light-emitting layer. The lower anodes can be given reflectivity by, for example, providing a reflective metal layer (e.g. of Al etc.) below the transparent electrically conductive oxide.

With a bottom emission type in which light is extracted in the direction of the substrate on which the lower anodes are formed, it is essential for the lower anodes to be transparent. In this case, the lower anodes are preferably formed using only a transparent electrically conductive oxide.

The upper cathodes in the case of the bottom emission type are required to have reflectivity so as to reflect the light emitted from the organic EL light-emitting layer. The upper cathodes can be formed from a material such as an electron injecting metal, alloy or compound as described above. Alternatively, the reflectivity may be increased by providing a reflective metal layer on such a material.

Publicly known materials are used as the materials of the various layers in the organic light-emitting layer mentioned above (the part of the above-mentioned layer structure excluding the two sets of electrodes). For example, to obtain luminescence from blue to blue/green in color, for example a fluorescent whitening agent of benzothiazole type, benzimidazole type, benzoxazole type or the like, a metal chelated oxonium compound, a styrylbenzene type compound, an aromatic dimethylidene type compound, or the like is preferably used as the organic EL light-emitting layer.

In the color conversion type organic EL display of the present invention, red color-converting filter layers, green color-converting filter layers and blue color-converting filter layers are each formed in a prescribed pattern.

The red color-converting filter layers contain red color-converting layers 7R in which a fluorescent colorant for converting light emitted from the organic EL light emitter into a red color is dispersed in a matrix resin. Red color filter layers 6R that contain a red colorant for improving the color purity of the red light emitted from the red color-converting layers may be laminated together with the red color-converting layers. In the present invention, 'color-converting filter layers' is a collective term for such, color-converting layers and color filter layers.

The green color-converting filter layers contain green color-converting layers 7G in which a fluorescent colorant for converting light emitted from the organic EL light emitter into a green color is dispersed in a matrix resin. Green color filter layers 6G that contain a green colorant for improving the color purity of the green light emitted from the green color-converting layers may be laminated together with the green color-converting layers. Moreover, in the case that the light emitted from the organic EL light emitter sufficiently contains a green component, the green color-converting filter layers may be constituted from such green color filter layers 6G only.

For the light in the blue region, the light from the organic light emitter may be converted using a fluorescent colorant and then outputted, but more preferably the light from the organic light emitter is merely outputted through blue color filter layers 6B. That is, the blue color-converting filter layers are preferably constituted from only blue color filter layers containing a blue colorant.

In the present invention, as organic fluorescent colorants for use in the red color-converting layers 7R that absorb light from the blue to blue/green region emitted from the organic EL device and emit fluorescence in the red region, for example rhodamine type colorants such as Rhodamine B, Rhodamine 6G, Rhodamine3B, Rhodamine 101, Rhodamine 110, sulforhodamines, Basic Violet 11 and Basic Red 2, cyanine type colorants, pyridine type colorants such as 1-ethyl-2-[4-(p-dimethylaminophenyl)-1,3-butadienyl]pyridinium perchlorate (Pyridine 1), oxazine type colorants, and so on can be used. Furthermore, various dyes (direct dyes, acid dyes, basic dyes, disperse dyes, etc.) can also be used if fluorescent.

As fluorescent colorants for use in the green color-converting layers 7G that absorb light from the blue to blue/green region emitted from the organic EL device and emit fluorescence in the green region, for example coumarin type colorants such as 3-(2'-benzothiazolyl)-7-diethylaminocoumarin (Coumarin 6), 3-(2'-benzoimidazolyl)-7-N,N-diethylaminocoumarin (Coumarin 7), 3-(2'-N-methylbenzoimidazolyl)-7-N,N-diethylaminocoumarin (Coumarin 30) and 2,3,5,6-1H,4H-tetrahydro-8-trifluoromethylquinolizino-(9,9a,1-gh)coumarin (Coumarin 153), and Basic Yellow 51, which is a coumarin colorant type dye, and also naphthalimide type colorants such as Solvent Yellow 11 and Solvent Yellow 116, and so on can be used. Furthermore, in the green color-converting layers, again various dyes (direct dyes, acid dyes, basic dyes, disperse dyes, etc.) can also be used if fluorescent.

The matrix resin used in the color-converting filter layers in the present invention is a light-curable or joint-light/heat-curable resin that is made insoluble and unmeltable by carrying out light and/or heat treatment, thus generating radical species or ionic species and hence polymerizing or crosslinking the resin.

The thickness of the color-converting layers comprising the organic fluorescent colorant material dispersed in the matrix resin is required to be 5 to 15 μm, with approximately 10 μm being optimum.

As described above, in the case that sufficient color purity cannot be obtained with only the color-converting layers, the color-converting filter layers are made to be laminates of color filter layers 6 and color-converting layers 7. Note that in the embodiments of the present invention, the light emitted from the organic EL device is blue to blue/green in color, and hence blue color filters only are formed for the blue pixels.

The red and green color filter layers preferably have a thickness of 1 to 1.5 μm. For the blue filters, because color-converting layers are not required, the filter layers are made thick with a thickness of approximately 10 μm, whereby a structure is obtained in which the thicknesses of the color-converting filters of the three colors are made approximately the same as each other, and hence extreme level changes do not occur.

A protective layer 8 covering the color-converting filter layers is preferably able to be formed without the functions of the color-converting filter layers being impaired, and preferably has high elasticity.

Moreover, a component forming the base of the protective layer 8 is preferably a material that has Tg of at least 100° C., and a surface hardness of at least pencil hardness 2H, for which a smooth coating film can be formed on the color-converting filter layers, and that does not cause deterioration in the functions of the color-converting filter layers. Such materials include, for example, light-curable resins and/or heat-curable resins such as imide-modified silicone resins (Japanese Patent Application Laid-open No. 5-134112, Japanese Patent Application Laid-open No. 7-218717, Japanese Patent Application Laid-open No. 7-306311, etc.), materials obtained by dispersing an inorganic metal compound ($TiO_2$, $Al_2O_3$, $SiO_2$, etc.) in an acrylic, polyimide or silicone resin or the like (Japanese Patent Application Laid-open No. 5-119306, Japanese Patent Application Laid-open No. 7-104114, etc.), epoxy-modified acrylate resins, which are UV-curable resins (Japanese Patent Application Laid-open No. 7-48424), acrylate monomer/oligomer/polymer resins having reactive vinyl groups, resist resins (Japanese Patent Application Laid-open No. 6-300910, Japanese Patent Application Laid-open No. 7-128519, Japanese Patent Application Laid-open No. 8-279394, Japanese Patent Application Laid-open No. 9-330793, etc.), sol-gel method inorganic compounds (Gekkan Display, 1997, Vol. 3, No. 7, Japanese Patent Application Laid-open No. 8-27934, etc.), and fluororesins (Japanese Patent Application Laid-open No. 5-36475, Japanese Patent Application Laid-open No. 9-330793). The component forming the base of the protective layer preferably has a Young's modulus of at least 0.3 MPa.

The light emitted by the organic EL device in the present invention is blue to blue/green in color, and hence to give the protective layer 8 a filter function of transmitting only the light emitted from the organic EL device, a suitable amount of a cyan type colorant or a cyan type pigment may be included. The content of this colorant or pigment is preferably adjusted such that the transmissivity at wavelengths of 450 to 510 nm is 80 to 90%, and the transmissivity around 600 nm is 20 to 30%. The appropriate content will depend on the specific material used, but is preferably from 0.1 to 3 mass %.

As a cyan type colorant, a cyanine type, azomethine type, or triphenylmethane type colorant or the like can be used. Moreover, examples of cyan type pigments include Heliogen (registered trade mark) Blue D-7565 (C.I. Pigment Blue 16), and also Heliogen (registered trademark) Blue L6700F (C.I. Pigment Blue 15:6), Heliogen (registered trademark) Blue D7072 D (C.I. Pigment Blue 15:3), Heliogen (registered trademark) Blue D 6900 D (C.I. Pigment Blue 15:1), Heliogen (registered trade mark) Blue D 6870 D (C.I. Pigment Blue 15:2), and Heliogen (registered trade mark) Blue D 7100 D (C.I. Pigment Blue 15:4).

For light incident on the protective layer 8 via the color-converting filter layers, yellow/green to red components are absorbed the cyan type colorant. The highly visible yellow/green component thus does not reach the lower electrodes, and hence the amount of reflected light is reduced accordingly, and thus the contrast can be improved.

Regarding the thickness of the protective layer 8, approximately 1 to 10 μm is possible, but since the protective layer 8 is formed using a method such as casting or spin coating, 3 to 5 μm is suitable.

For a passivation layer 9 on the organic EL device, a material that is electrically insulating, acts as a barrier against moisture and low-molecular-weight components, and preferably has a film hardness of at least pencil hardness 2H is used.

For example, an inorganic oxide or inorganic nitride such as $SiO_x$, $SiN_x$, $SiN_xO_y$, $AlO_x$, $TiO_x$, $TaO_x$ or $ZnO_x$, or the like can be used. There are no particular restrictions on the method of forming the passivation layer 9, with it being possible to form the passivation layer 9 using sputtering, CVD, vacuum deposition or the like. So long as there is no direct adverse effect on the organic EL device, the passivation layer 9 can also be formed using a commonly used method such as dipping.

To give the passivation layer 9 a filter function of transmitting only the light emitted from the organic EL device, doping with a small amount of a transition metal may be carried out when forming the oxide or nitride layer. For example, in the case of $AlO_x$, doping with Co or Mn is carried out, whereby the $AlO_x$ layer is made to absorb in the region around 600 nm. The doping amount of the transition metal is preferably adjusted such that the passivation layer has a transmissivity at wavelengths of 450 to 510 nm of 80 to 90%, and a transmissivity around 600 nm of 20 to 30%. A suitable doping amount is from 0.1 to 3.0 atom %.

The passivation layer may be a single layer, but the effect of the passivation layer will be increased if the passivation layer comprises a plurality of layers formed on top of one another. The thickness of such a multi-layered passivation layer is preferably 0.1 to 5 μm.

In the case of a top emission structure, the display is constituted by aligning and then bonding together a substrate having the color-converting filter layers formed thereon and a substrate having the organic EL device thereon. In this case, a filler layer 10 is provided between the two substrates. As the filler, an inorganic material such as $SiO_x$, $SiO_xN_y$, $AlN_x$, $SiAlO_xN_y$ or $TiO_x$, or an organic material such as an acrylic resin, a silicone gel or a silicone rubber can be used.

The filler layer 10 may also comprise an adhesive. Adhesives that can be used include rubber type adhesives such as natural rubber, IR, SBR or NBR, acrylic type adhesives, and silicone type adhesives. Of these, from the viewpoint of preventing peeling away after the bonding, it is preferable to use a highly crosslinked acrylic type adhesive.

To give the filler layer 10 a filter function of transmitting only the light emitted from the organic EL device, a suitable amount of a cyan type colorant or a cyan type pigment may be included. The content of this colorant or pigment is adjusted such that the filler layer has a transmissivity at wavelengths of 450 to 510 nm of 80 to 90%, and a transmissivity around 600 nm of 20 to 30%. The content will depend on the specific material used, but is preferably from 0.1 to 3 mass %. Cyan type colorants and cyan type pigments that can be used are as mentioned for the protective layer.

A first preferable embodiment of the present invention is a top emission type organic EL display as shown in FIG. 1.

An organic EL device comprising lower anodes 2, an organic light-emitting layer 3 and an upper transparent cathode 4 is formed on a TFT substrate 1. On the other hand, desired color-converting filter layers are formed on a transparent substrate 12. In FIG. 1, blue, green and red color-converting filter layers are formed; the blue color-converting filter layers are constituted from blue color filter layers 6B, and the green and red color-converting filter layers are constituted from laminates of color filter layers 6G or 6R and color-converting layers 7G or 7R. Moreover, a black mask 13 is formed between the color-converting filter layers. Next, a protective layer 8 is formed on the color-converting filter layers and the black mask, and then a passivation layer 9 is formed so as to cover the above-mentioned layers, whereby a color-converting filter substrate is obtained. Next, the organic EL device and the color-converting filter are aligned and bonded together while forming a filler layer 10 therebetween, and then finally peripheral parts are sealed using a sealing resin 11, whereby the organic EL display is obtained.

In the organic EL display of the present embodiment, one out of the protective layer 8, the passivation layer 9 and the filler layer 10 may have a color filter function of transmitting the color of the light emitted from the organic EL device. Alternatively, two or more of these layers may have such a color filter function.

In the case that two or more of the layers have a color filter function, adjustment is preferably carried out such that these layers as a whole have a transmissivity at wavelengths of 450 to 510 nm of 80 to 90%, and a transmissivity around 600 nm of 20 to 30%. Through two or more of the layers having a color filter function, the amount added of a colorant or pigment to each of these layers can be reduced, and hence adverse effects on other properties of these layers can be suppressed. Alternatively, different colorants or pigments may be added to each of the two or more layers so that a desired spectrum can be obtained overall.

Figure 2:
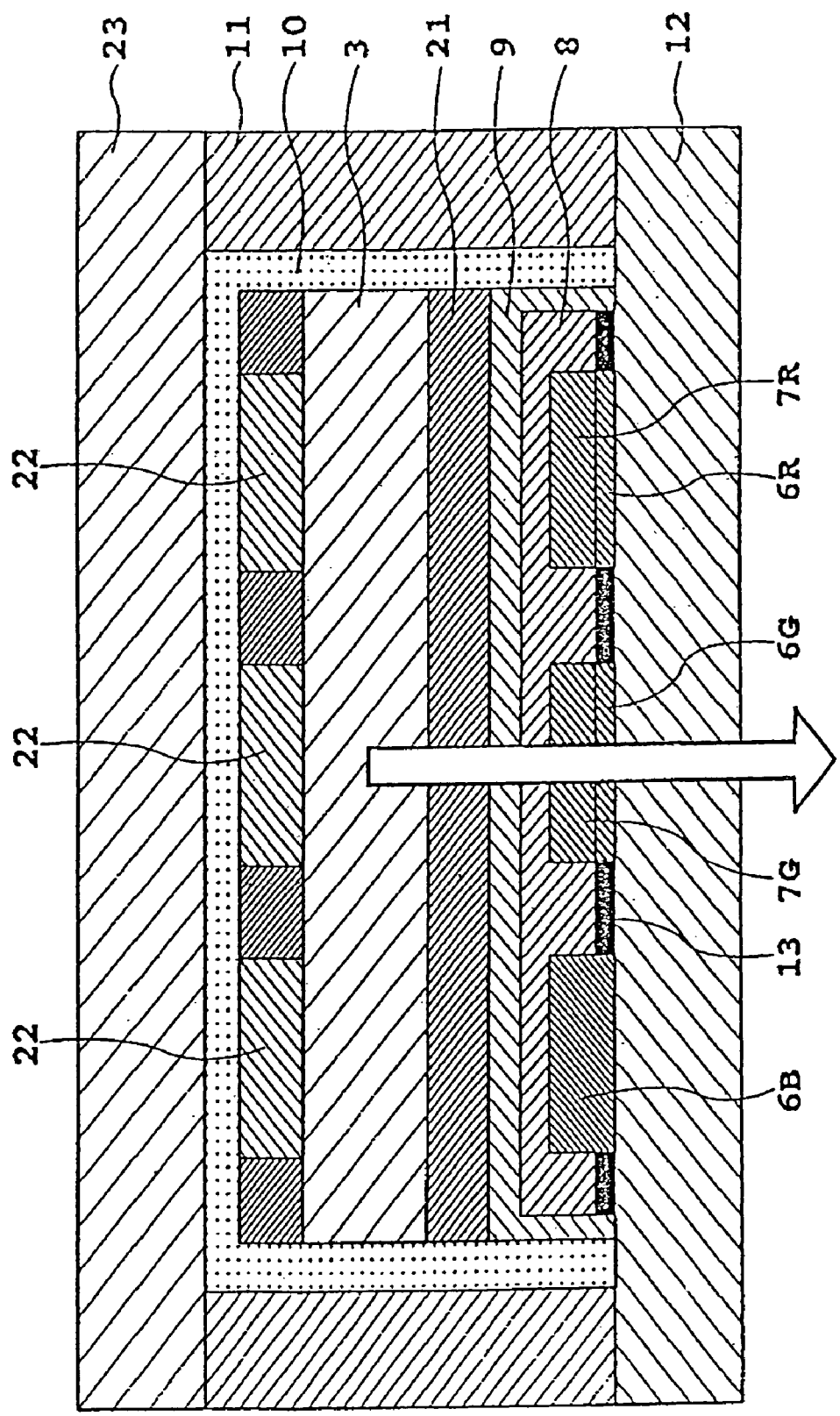
FIG. 2 is a schematic sectional view showing a bottom emission type organic EL display of the present invention.

A second preferable embodiment of the present invention is a bottom emission type organic EL display as shown in FIG. 2.

Desired color-converting filter layers are formed on a transparent substrate 12. In the present embodiment, blue (6B), green (6G, 7G) and red (6R, 7R) color-converting filter layers are formed, and the constitution thereof is the same as in the first embodiment. Moreover, a black mask 13 is formed between the color-converting filter layers. Next, a protective layer 8 is formed on the color-converting filter layers and the black mask, and then a passivation layer 9 is formed so as to cover the above-mentioned layers. An organic EL device comprising transparent electrodes 21, an organic light-emitting layer 3 and upper electrodes 22 is then formed thereon. Here, FIG. 2 shows a constitution for carrying out passive matrix driving, with the transparent electrodes 21 and the upper electrodes 22 being formed in mutually orthogonal line patterns. Finally, the whole is sealed using a filler layer 10, a sealing resin 11 and a sealing substrate 23, whereby the organic EL display is obtained.

In the organic EL display of the present embodiment, either of the protective layer 8 and the passivation layer 9 may have a color filter function of transmitting the color of the light emitted from the organic EL device. Alternatively, both of these layers may have such a color filter function. In the case that both of the layers have a color filter function, adjustment is preferably carried out such that these layers as a whole have a transmissivity at wavelengths of 450 to 510 nm of 80 to 90%, and a transmissivity around 600 nm of 20 to 30%. Through both of the layers having a color filter function, the amount added of a colorant or pigment to each of these layers can be reduced, and hence adverse effects on other properties of these layers can be suppressed. Alternatively, different colorants or pigments may be added to each of the two layers so that a desired spectrum can be obtained overall.

The organic EL display of the present invention may use active matrix driving or passive matrix driving. In the case of carrying out active matrix driving, a constitution may be adopted in which the lower electrodes are partitioned with there being one lower electrode for each light-emitting part, and the lower electrodes are connected, for example, to the sources of TFTs provided on a substrate. In this case, the upper cathode can be made to be a single unified electrode. On the other hand, in the case of carrying out passive matrix driving, a constitution can be adopted in which the lower anodes and the upper cathodes comprise patterns of lines extending in mutually orthogonal directions.

In the embodiments of the present invention, a construction has been described in which a color filter function is given to a layer having another function in the organic EL display, but a layer having only such a filter function may be separately formed. Such a layer having only a filter function can be provided in at least positions corresponding to the color-converting filter layers of the various colors, or may be provided over the whole of the substrate. A base resin of the layer having only the filter function may be a light-curable or joint-light/heat-curable resin as with the matrix resin of the color-converting filter layers, or may be any of various resins that can be used in a protective layer. The layer having only the filter function can be formed by adding a cyan type colorant as described earlier to this base resin, and adjusting such that the layer has a transmissivity at wavelengths of 450 to 510 nm of 80 to 90%, and a transmissivity around 600 nm of 20 to 30%.

EXAMPLE 1

As shown in FIG. 1, a construction was adopted in which bottom gate type TFTs were formed on a glass substrate 1, and a lower anode 2 was connected to the source of each TFT. For each of the anodes 2, Al, which was connected to the source of the corresponding TFT via a contact hole (not shown) formed in an insulating film (not shown) on the TFT, was formed as a lower part, and IZO (InZnO) was formed on the upper surface thereof.

The Al film is provided to reflect light emitted from the light-emitting layer so that light is emitted efficiently from the top, and to reduce the electrical resistance. The thickness of the Al film was made to be 300 nm. The upper part IZO has a high work function, and hence is provided so that holes can be injected efficiently. The thickness of the IZO was made to be 200 nm.

The substrate 1 having the lower anodes 2 formed thereon was put into a resistive heating vapor deposition apparatus, and a hole injection layer, a hole transport layer, an organic light-emitting layer, and an electron injection layer were deposited in this order without releasing the vacuum, thus forming an organic EL device.

During the deposition, the pressure inside the vacuum chamber was reduced down to $1 \times 10^{-4}$ Pa. Copper phthalocyanine (CuPc) was formed to a thickness of 100 nm as the hole injection layer. 4,4'-bis[N-(1-naphthyl)-N-phenylamino]biphenyl (α-NPD) was formed to a thickness of 20 nm as the hole transport layer.

4,4'-bis(2,2-diphenylvinyl)biphenyl (DPVBi) was formed to a thickness of 30 nm as the organic EL light-emitting layer. Aluminum tris(8-quinolinolate) (Alq) was formed to a thickness of 20 nm as the electron injection layer.

After that, an upper transparent cathode 4 was formed using a metal mask without releasing the vacuum.

The upper transparent cathode 4 was formed by depositing metallic Mg/Ag, which has a low work function as required for injection of electrons, to a thickness of 2 nm using a codeposition method, and then depositing an IZO film thereon to a thickness of 200 nm using a sputtering method.

On the other hand, a blue filter material (made by Fuji Hunt Electronics Technology; Color Mosaic CB-7001) was applied using a spin coating method onto a transparent (glass) substrate 12, and then patterning was carried out using a photolithography method, thus obtaining a line pattern with a thickness of 10 μm.

Green and red color filter layers 6G and 6R made of similar color filter materials were applied using a spin coating method onto the transparent substrate 12, and then patterning was carried out using a photolithography method, thus obtaining line patterns with a thickness of 1.5 μm.

Coumarin 6 (0.7 parts by weight) as a green fluorescent colorant was dissolved in 120 parts by weight of a propylene glycol monoethyl acetate (PGMEA) solvent. 100 parts by weight of a photopolymerizable resin 'V259PA/P5' (trade name, Nippon Steel Chemical Co., Ltd.) was then added and dissolved, thus obtaining a coating liquid. This coating liquid was applied using a spin coating method onto the green color filter layers 6G on the transparent substrate 12, and then patterning was carried out using a photolithography method, thus obtaining a line pattern with a thickness of 10 μm.

Coumarin 6 (0.6 parts by weight), Rhodamine 6G (0.3 parts by weight) and Basic Violet 11 (0.3 parts by weight) as red fluorescent colorants were dissolved in 120 parts by weight of a propylene glycol monoethyl acetate (PGMEA) solvent. 100 parts by weight of a photopolymerizable resin 'V259PA/P5' (trade name, Nippon Steel Chemical Co., Ltd.) was then added and dissolved, thus obtaining a coating liquid. This coating liquid was applied using a spin coating method onto the red color filter layers 6R on the substrate 12, and then patterning was carried out using a photolithography method, thus obtaining a line pattern with a thickness of 10 µm.

A black mask 13 (thickness 1.5 µm) was formed between the color-converting filter layers of the various colors. As a black mask having high thermal conductivity, first a chromium oxide layer of thickness 500 nm was formed by sputtering using a mask enabling formation of a lattice pattern on walls of the color-converting filter layers. Next, using a similar mask, an SiN film was formed by sputtering around the R, G and B sub-pixels so as to be the same thickness. The pitch of the pixels was 0.3×0.3 mm, and the shape of the sub-pixels of the various colors was 0.1×0.3 mm.

A matrix material of a protective layer to be formed on an upper surface of the color-converting filter layers was made to be ZPN 1100 (made by Nippon Zeon Co., Ltd.). Heliogen (registered trade mark) Blue D-7565 (C.I. Pigment Blue 16) was mixed and dispersed to a content of approximately 3.0 mass % into this matrix material, the dispersion was applied on using a spin coating method, and then patterning was carried out using a photolithography method, thus forming the protective layer on the color-converting filter layers. The thickness from the surface of the color-converting layers was 3 µm.

The above dispersion was separately applied onto a glass substrate to a thickness of 3 µm, and the transmission spectrum was measured. The transmissivity at a wavelength of 470 nm was 80%, and the transmissivity at a wavelength of 610 nm was 20%.

An $SiON_x$ film was deposited by sputtering to a thickness of 300 nm as a passivation layer 9.

The TFT substrate having the organic EL layer 3 and the upper transparent cathode 4 formed on the lower anodes 2, and the color-converting filter substrate having the color filter layers 6, the color-converting layers 7, the protective layer 8 and the passivation layer 9 formed thereon obtained as described above were bonded together using a UV-curing sealing resin 11. At this time, the space between the two substrates was filled with a material such as a silicone gel as a filler layer 10.

EXAMPLE 2

An organic EL display was manufactured as in Example 1, except that the Heliogen (registered trademark) Blue D-7565 pigment was not added to the protective layer, and a passivation layer was deposited to a thickness of 300 nm by sputtering using $Al_2O_3$ doped with 1.0 at % of Co as a target.

A layer of thickness 300 nm was separately formed on a glass substrate by sputtering using the above target, and the transmission spectrum was measured. The transmissivity at a wavelength of 470 nm was 80%, and the transmissivity at a wavelength of 600 nm was 30%.

EXAMPLE 3

An organic EL display was manufactured as in Example 1, except that the Heliogen (registered trade mark) Blue D-7565 pigment was not added to the protective layer, and a silicone gel having 3.0 mass % of the Heliogen (registered trade mark) Blue D-7565 dispersed therein was used as the filler. Here, the filler layer had a thickness of 5.0 µm at parts corresponding to the color-converting filter layers.

The above filler was separately applied onto a glass substrate to a thickness of 5.0 µm, and the transmission spectrum was measured. The transmissivity at a wavelength of 470 nm was 80%, and the transmissivity at a wavelength of 600 nm was 20%.

COMPARATIVE EXAMPLE 1

An organic EL display was manufactured as in Example 1, except that the Heliogen (registered trademark) Blue D-7565 pigment was not added to the protective layer.

Evaluation

For the organic EL displays manufactured in Examples 1 to 3 and Comparative Example 1, the contrast ratio was measured in accordance with the measurement method of JIS Z8513. The measurement results are shown in Table 1. The contrast ratio is represented as the ratio 'brightness when emitting light: brightness when not emitting light' for the case of 1000 lx of external light from 45°.

TABLE 1

| Evaluation of Results | |
|---|---|
| | Contrast Ratio |
| Example 1 | 100:1 |
| Example 2 | 90:1 |
| Example 3 | 110:1 |
| Comparative Example 1 | 60:1 |

The present invention can be used with an organic EL display. According to the present invention, as described above, in the case of an organic EL display having an organic EL device comprising lower electrodes, upper electrodes and an organic EL light-emitting layer therebetween, and color-converting layers that absorb light emitted from the organic EL device and carry out fluorescent conversion, or color filter layers, or color-converting filter layers comprising such color-converting layers and color filter layers formed on top of one another, a constitution has been adopted in which a layer having a color filter function of transmitting only the color of the light emitted from the organic EL device is provided between the color-converting layers or color-converting filter layers and the organic EL device; as a result, out of light infiltrating into the organic EL display from the outside, the color complementary to the color of the light emitted by the organic EL device, i.e. a red/green color in the present examples, is absorbed along the way and hence does not reach the lower electrodes, whereby the amount of reflected light is reduced accordingly, and hence the contrast ratio for the organic EL display can be improved.

What is claimed is:
1. An organic EL display comprising:
an organic EL device including lower electrodes, upper electrodes, and an organic EL layer between the lower electrodes and upper electrodes;
color-converting filter layers that absorb light emitted from said organic EL device and carry out color conversion;
at least one layer selected from the group consisting of a protective layer, a passivation layer and a filler layer, the at least one layer being formed between the color-converting filter layers and the organic EL device; and
a material added to at least one of the protective layer, the passivation layer and the filler layer, the material causing the layer in which it is contained to transmit light that is the same color as the light emitted by the organic EL device, wherein the light emitted by the EL device is blue to blue/green in color and the tranmissivity of the layer or layers containing the material is 80 to 90% at wavelengths of 450 to 510 nm and 20 to 30% at a wavelength around 600 nm.

2. The organic EL display according to claim 1, wherein the material is added to the protective layer.

3. The organic EL device according to claim 2, wherein the material added is a colorant or pigment.

4. The organic EL display according to claim 1, wherein the material is added to the passivation layer.

5. The organic EL device according to claim 4, wherein the passivation layer comprises an inorganic oxide or nitride and the material added to the passivation layer is a transition metal.

6. The organic EL display according to claim 1, wherein the material is added to the filler layer.

7. The organic EL device according to claim 6, wherein the material added is a colorant or pigment.

8. The organic EL device according to claim 1, comprising at least two layers selected from the group consisting of a protective layer, a passivation layer and a filler layer, wherein the material is included in each of the at least two layers.

9. The organic EL device according to claim 8, wherein a different material is added to each of the two layers.

10. The organic EL device according to claim 1, comprising a protective layer, a passivation layer and a filler layer, wherein the material is included in at least two of the layers.

11. The organic EL device according to claim 10, wherein the material is included in all three of the layers.

12. The organic EL device according to claim 1, wherein the display is a top emission display.

13. The organic EL device according to claim 1, wherein the display is a bottom emission display.

14. The organic EL device according to claim 1, wherein the display comprises either a protection layer or a filler layer, and the material in the protection layer and/or the filler layer is a cyan colorant or pigment.

15. The organic EL device according to claim 1, wherein (i) the display comprises at least two layers selected from the group consisting of a protective layer, a passivation layer and a filler layer, (ii) two or more of the layers contain the material, and (iii) the combination of layers have a transmissivity of 80 to 90% at wavelengths of 450 to 510 nm and 20 to 30% at a wavelength around 600 nm.

* * * * *